(12) United States Patent
Kushitani et al.

(10) Patent No.: US 6,768,383 B2
(45) Date of Patent: Jul. 27, 2004

(54) HIGH-FREQUENCY AMPLIFIER

(75) Inventors: Hiroshi Kushitani, Osaka (JP);
Hisayoshi Kato, Gifu (JP); Michiaki Tsuneoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/220,113

(22) PCT Filed: Dec. 14, 2001

(86) PCT No.: PCT/JP01/10993
§ 371 (c)(1),
(2), (4) Date: Dec. 4, 2002

(87) PCT Pub. No.: WO02/054585
PCT Pub. Date: Jul. 11, 2002

(65) Prior Publication Data
US 2004/0027204 A1 Feb. 12, 2004

(30) Foreign Application Priority Data
Dec. 28, 2000 (JP) ........................ 2000-400451

(51) Int. Cl.[7] ............................. H03F 3/191; H03F 3/60
(52) U.S. Cl. ...................................... 330/302; 330/286
(58) Field of Search ................................. 330/286, 296, 330/302, 306, 307

(56) References Cited
U.S. PATENT DOCUMENTS
5,105,172 A * 4/1992 Khatibzadeh et al. ....... 333/175
6,177,841 B1 * 1/2001 Ohta et al. ................... 330/302
6,373,331 B1 * 4/2002 Smiley et al. ............. 330/302 X

FOREIGN PATENT DOCUMENTS
JP 06-140862 5/1994
JP 11-205052 7/1999

OTHER PUBLICATIONS
Japanese search report for PCT/JP01/10993 dated Dec. 14, 2001.
English translation of Form PCT/ISA/210.

* cited by examiner

Primary Examiner—Steven J. Mottola
(74) Attorney, Agent, or Firm—RatnerPrestia

(57) ABSTRACT

A bias circuit is provided for attenuating harmonic distortions of a signal having a simple construction and which can be applied to a high-frequency amplifier used in a communication device, such as a mobile telephone. The circuit reduces a voltage drop therein and thus provides a high-frequency amplifier having reduced power consumption and an increased operating efficiency. The high-frequency amplifier includes an amplifier circuit, an output matching circuit, and the bias circuit. In the bias circuit, a parallel circuit including a first transmission line and a first capacitor has one end connected between the amplifier and the output matching circuit. The other end of the parallel circuit is connected to a power source and is grounded via a second capacitor. In the circuit, the bias circuit can be short-circuited in a desired frequency band while being an open circuit in a frequency band of a signal to be amplified, hence attenuating the harmonic distortions without using a low pass filter.

97 Claims, 15 Drawing Sheets

HIGH-FREQUENCY AMPLIFIER

THIS APPLICATION IS A U.S. NATIONAL PHASE APPLICATION OF PCT INTERNATIONAL APPLICATION PCT/JP01/10993.

TECHNICAL FIELD

The present invention relates to a high-frequency amplifier for use in a communications device such as a mobile telephone.

BACKGROUND ART

A conventional high-frequency amplifier shown in FIG. 14 generally includes a transmission line 1403 having one end connected between an amplifier circuit 1401 and an output matching circuit 1402 and the other end connected to a power source 1405 and is grounded via a capacitor 1404.

The transmission line 1403 is designed to have ¼ the wavelength of a frequency band of a signal be amplified by the amplifier circuit 1401. The capacitance of the capacitor 1404 is set to a level great enough to short-circuit in the frequency band.

A bias current received from the power source 1405 is a direct current and thus does not flow through the capacitor 1404 but flows through the transmission line 1403 to drive the amplifier circuit 1401. The amplifier circuit 1401 amplifies a signal in the frequency band and may simultaneously generate harmonic distortions in a band of n times greater than the frequency band (where n is an integer). The capacitor 1404 is short-circuited in the frequency band and the length of the transmission line 1403 is equal to ¼ the wavelength. As a result, the transmission line 1403 is inverted in phase at one end and stays open, thus allowing the amplified signal to be received not by a bias circuit 1406 but by the output matching circuit 1402.

In the frequency band of 2n times greater than the band, the capacitor 1404 is short-circuited. Also, the length of the transmission line 1403 is equal to ½ the wavelength. Therefore, the bias circuit 1406 functions as a notch circuit. As a result, the harmonic distortions at 2n times the frequency band can be attenuated and hardly received by the output matching circuit 1402.

FIG. 15 illustrates a frequency response of a conventional high-frequency amplifier including an amplifier circuit 1401 having an output impedance of 3.2-j5.7Ω in an output frequency band of 900MHz.

Since the bias circuit of the conventional high-frequency amplifier develops an insufficient short-circuit across the capacitor at the frequencies of second and third harmonics, a low pass filter needs to be connected after the matching circuit for attenuating the harmonic distortions. This increases the overall size of the circuit, and reduces the operating efficiency of the conventional high-frequency amplifier due to a loss of the added low pass filter; thus increasing current consumption for producing a desired level of power.

SUMMARY OF THE INVENTION

A high-frequency amplifier includes (a) an amplifier circuit, (b) an output matching circuit, and (c) a bias circuit. The bias circuit includes a parallel circuit constructed by a first capacitor and a first transmission line having a first end connected between the amplifier circuit and the output matching circuit and a second end connected to a power source, and a second capacitor having a first end connected to a second end of the parallel circuit and a second end grounded.

While remaining open in a frequency band of a signal to be amplified by the amplifier, the bias circuit is short-circuited in a desired frequency band. This allows undesired harmonic distortions in the signal to be attenuated without using a low pass filter.

DESCRIPTION OF THE PREFERRED EMBODIMENTS

Embodiment 1

Figure 1:
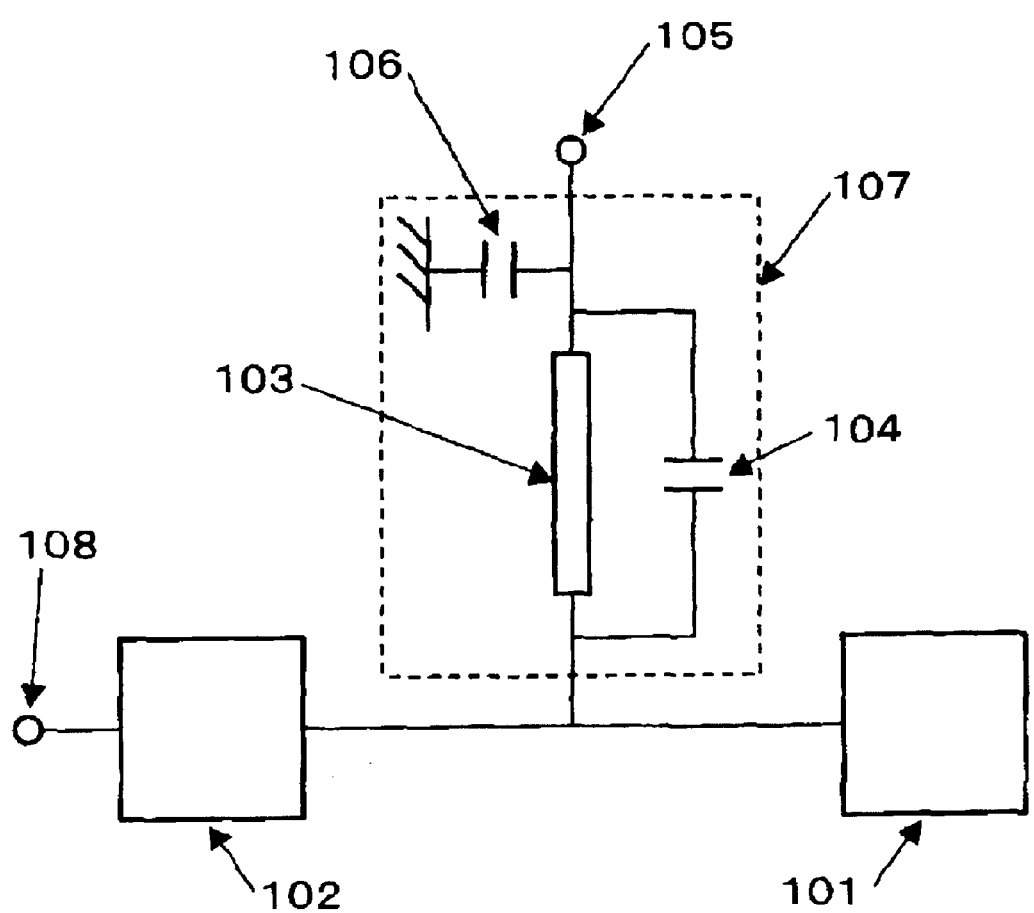
FIG. 1 is a circuitry diagram of a high-frequency amplifier according to Embodiment 1 of the present invention.

FIG. 1 is a circuit diagram of a high-frequency amplifier according to Embodiment 1 of the present invention. A parallel circuit is constructed by a first transmission line 103 and a first capacitor 104 and has one end connected between an amplifier circuit 101 and an output matching circuit 102. The other end of the parallel circuit is connected to a power source 105 and is grounded via a second capacitor 106.

An operation of the high-frequency amplifier will be described. In the following description, the amplifier amplifies a signal in a frequency band f, and doubled and tripled frequency bands of the band f are expressed by a frequency band 2f and a frequency band 3f, respectively (a frequency band 4f, a frequency band 5f, and so on).

The first transmission line 103 has a length equal to ½ the wavelength of the frequency band 3f. A capacitance of the first capacitor 104 is determined so that the parallel circuit including the first transmission line 103 may have a high impedance or an open in the frequency band f. A capacitance of the second capacitor 106 is set to a level great enough to be a short-circuit in a frequency band higher than the band f.

A bias current received from the power source 105, being a direct current, flows not in the first capacitor 104 and the second capacitor 106 but in the first transmission line 103 to drive the amplifier circuit 101. The amplifier circuit 101 amplifies a signal in the frequency band f and may simultaneously generate harmonic distortions. As the parallel circuit including the first transmission line 103 and the first capacitor 104 is an open in the frequency band f, the amplified signal is received not by the bias circuit 107 but by the output matching circuit 102.

Since the second capacitor 106 is short-circuited in the frequency band 3f, and since the length of the first transmission line 103 is equal to ½ the wavelength, the bias circuit 107 functions as a notch circuit. This attenuates the harmonic distortions in a signal in the frequency band 3f, which thus does not flow in the output matching circuit 102.

The length of the first transmission line 103 of Embodiment 1 is ½ the wavelength in the frequency band 3f. The length may be ½ the wavelength in a frequency m×f (where n is a prime number not smaller than 3). In this case, the amplifier attenuates the harmonic distortions of a signal at n times the frequency band.

Figure 2:
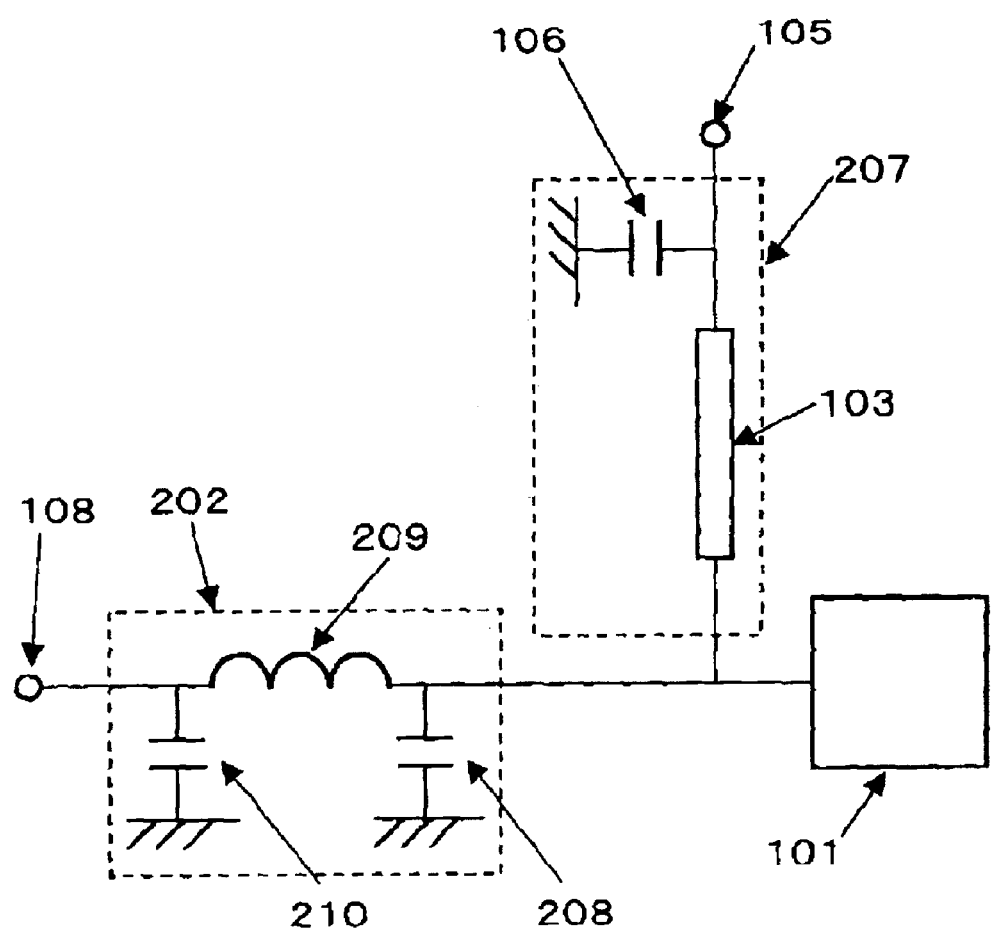
FIG. 2 is a circuitry diagram of another high-frequency amplifier according to Embodiment 1.

As shown in FIG. 2, an output matching circuit 202 may include a third capacitor 208, a first inductor 209, and a fourth capacitor 210. The third capacitor 208 has one end connected to the amplifier circuit 101, the first transmission line 103, and one end of the first inductor 209. The other end of the first inductor 209 is connected to one end of the fourth capacitor 210. The third capacitor 208 and the fourth capacitor 210 have the other ends grounded. A bias circuit 207 may exclude the first capacitor 104. The output matching circuit 202 may have an output impedance of 50Ω in the frequency band f. Since the second capacitor 106 is short-circuited in a frequency band higher than the band f, the first transmission line 103, the first capacitor 104 connected in parallel with the first transmission line 103, and the third capacitor 208 are regarded to connect in parallel with each other in the frequency band f. This allows the first capacitor 104 and the third capacitor 208 to be combined, and thus allows the first capacitor 104 shown in FIG. 1 to be eliminated.

Figure 3:
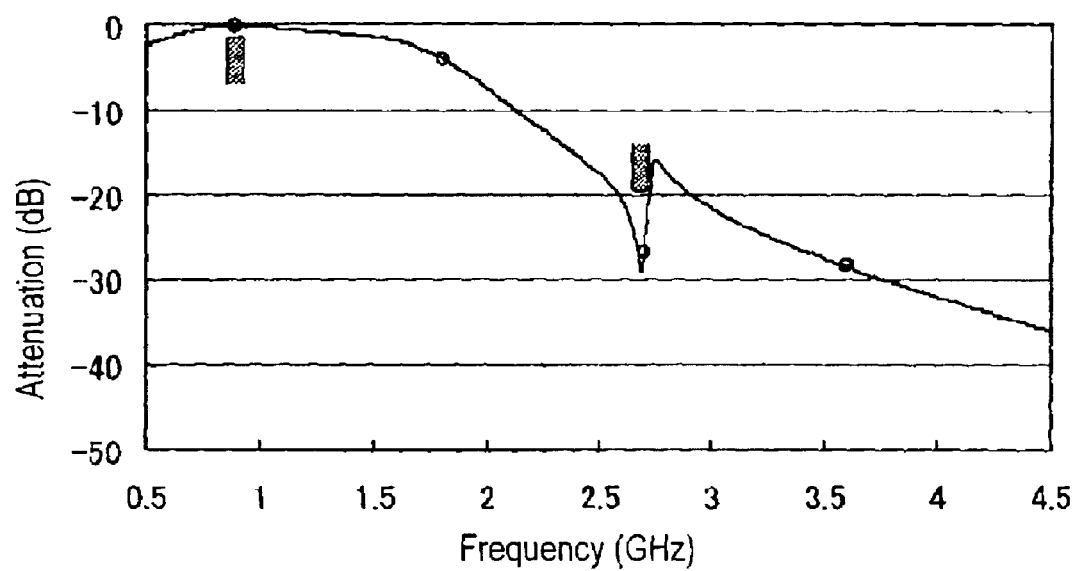
FIG. 3 is a frequency response diagram of the high-frequency amplifier according to Embodiment 1.

FIG. 3 illustrates a frequency response of the amplifier where an output impedance the amplifier circuit 101 is 3.2-j5.7Ω at f=900 MHz. As apparent, matching is achieved at the frequency band f, and the signal thus passes. In the frequency band 3f, the signal does not pass.

While the transmission line and the capacitors of Embodiment 1 may be implemented by any applicable manner, the present invention is not limited to details of the implementation.

A mobile communication device equipped with the high-frequency amplifier of Embodiment 1 can attenuate the harmonic distortions with its simple circuitry arrangement thus having a reduced overall size and an improved performance.

Embodiment 2

Figure 4:
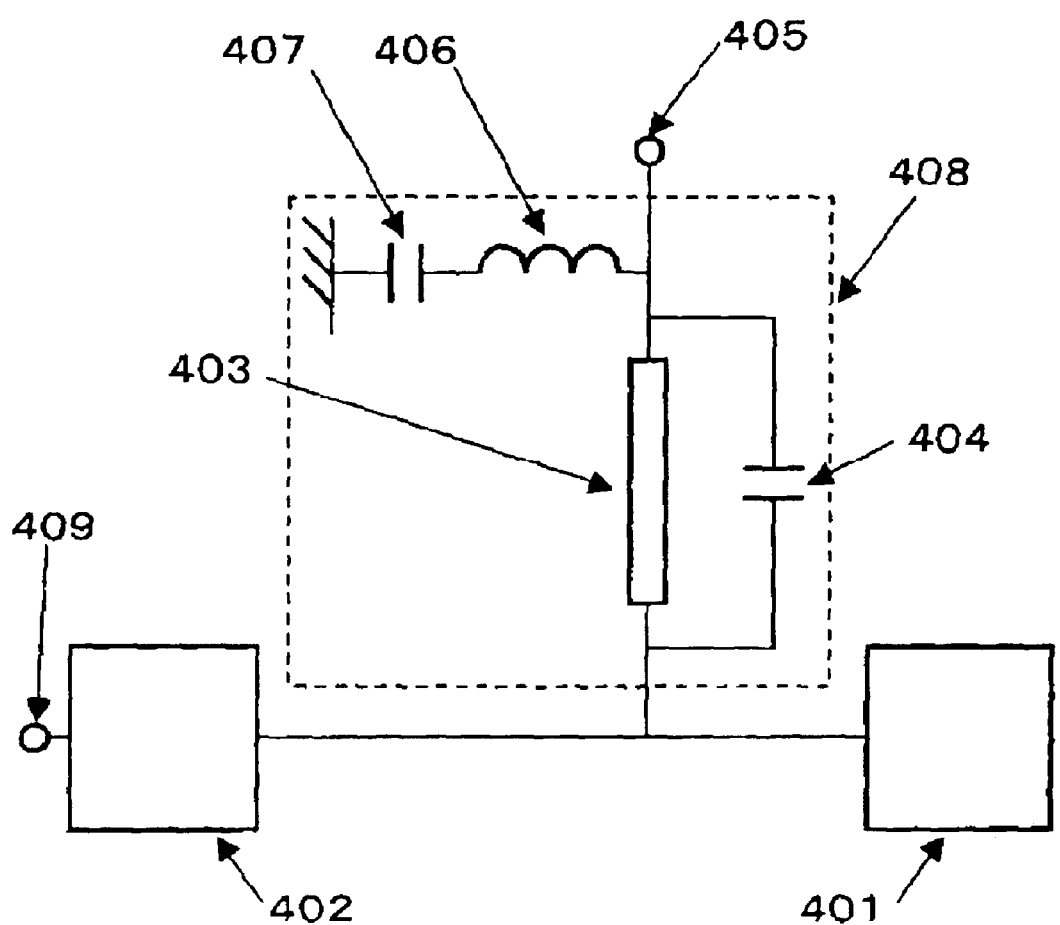
FIG. 4 is a circuitry diagram of a high-frequency amplifier according to Embodiment 2 of the invention.

FIG. 4 is a circuit diagram of a high-frequency amplifier according to Embodiment 2 of the present invention. A parallel circuit constructed by a second transmission line 403 and a fifth capacitor 404 has one end connected between an amplifier circuit 401 and an output matching circuit 402. The other end of the parallel circuit is connected to a power source 405 and one end of a second inductor 406. The other end of the second inductor 406 is connected to one end of a sixth capacitor 407. The other end of the sixth capacitor 407 is grounded.

An operation of the high-frequency amplifier will be described.

The second transmission line 403 has a length equal to ¼ the wavelength in the frequency band f. A capacitance of the fifth capacitor 404 is determined so that the parallel circuit including the second transmission line 403 may have a high impedance or an open in the frequency band f. A capacitance of the sixth capacitor 407 is set to a level great enough to be short-circuited in a frequency band higher than the band f, while the capacitance does not affect an impedance condition of each component in the bias circuit 408.

A bias current from the power source 405, being a direct current, flows not in the fifth capacitor 404 and the sixth capacitor 407 but in the second transmission line 403 to drive the amplifier circuit 401. The amplifier circuit 401 amplifies a signal in the frequency band f and may simultaneously generate harmonic distortions. Since the parallel circuit including the second transmission line 403 and the fifth capacitor 404 is an open in the frequency band f, the amplified signal flows not in the bias circuit 407 but in the output matching circuit 402.

Since being an open in the frequency band f, the parallel circuit constructed by the second transmission line 403 and the fifth capacitor 404 has a capacitive composite impedance in a frequency band higher than the band f. The second inductor 406 has an inductance so that the composite impedance series-resonates in the frequency band n×f (where n is an integer not smaller than 2). Since the sixth capacitor 407 is short-circuited in the frequency band n×f, the bias circuit 408 functions as a notch circuit. Hence, the harmonic distortions in an amplified signal at the frequency band n×f, since being attenuated, is not transferred to the output matching circuit 402. Since the second transmission line 403 has a shorter length than the first transmission line 103 of Embodiment 1, a voltage drop due to the bias current is reduced, thus improving an efficiency of the amplifier.

While the transmission line and capacitors in Embodiment 2 may be implemented by any applicable manner, the present invention is not limited to the details of the implementation.

A mobile communication device equipped with the high-frequency amplifier of Embodiment 2 can attenuate harmonic distortions with its simpler circuitry arrangement and decrease the voltage drop due to the bias current, thus having a reduced overall size and an improved performance.

Embodiment 3

Figure 5:
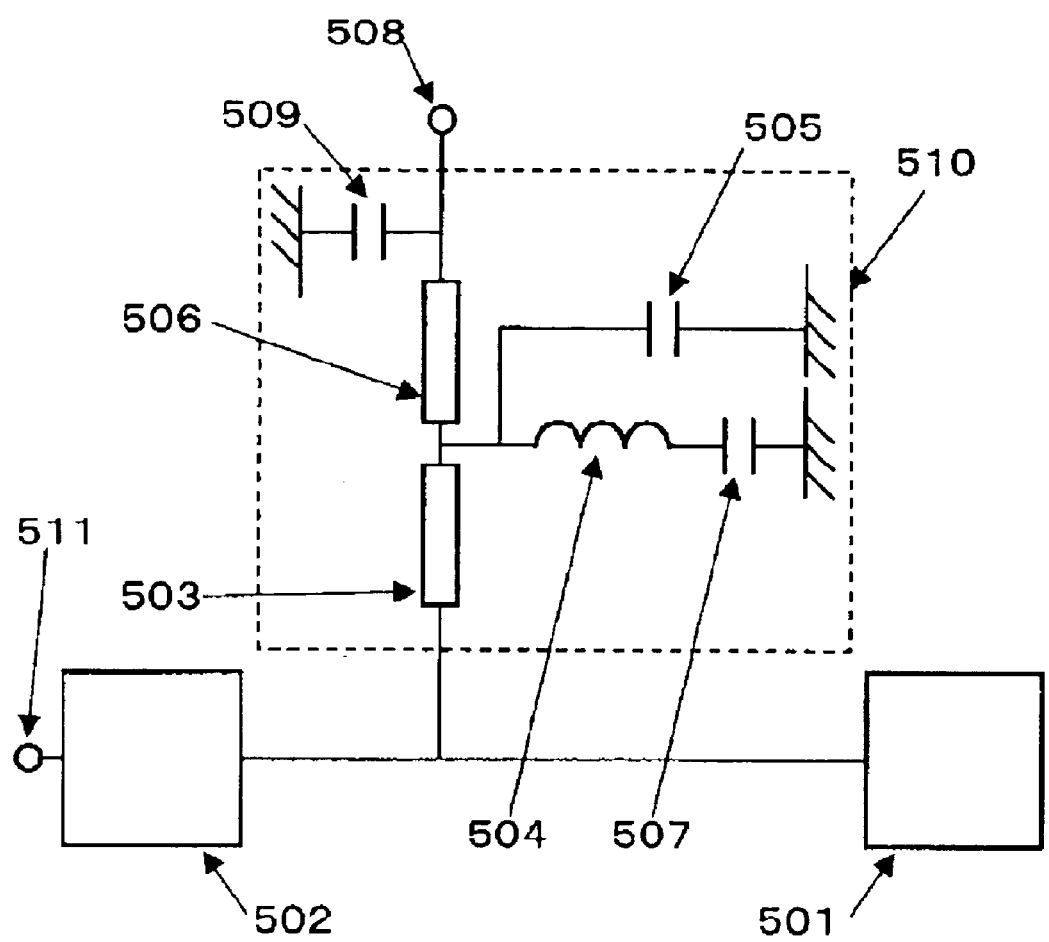
FIG. 5 is a circuitry diagram of a high-frequency amplifier according to Embodiment 3 of the invention.

FIG. 5 is a circuit diagram of a high-frequency amplifier according to Embodiment 3 of the present invention. A third transmission line 503 has one end connected between an amplifier circuit 501 and an output matching circuit 502. The other end of the third transmission line 503 is connected to one end of a third inductor 504, one end of a seventh capacitor 505, and one end of a fourth transmission line 506. The other end of the third inductor 504 is connected to one end of an eighth capacitor 507. The seventh capacitor 505 and the eighth capacitor 507 have the respective other end grounded. The other end of the fourth transmission line 506 is connected to a power source 508 and is grounded via a ninth capacitor 509.

An operation of the high-frequency amplifier will be described.

The third transmission line 503 has a length equal to ½ the wavelength in the frequency band 3f. A capacitance of the seventh capacitor 505 is set to a level great enough to be short-circuited in a frequency band higher than the band f. An inductance of the third inductor 504 is determined so that the parallel circuit including the seventh capacitor 505 may have a high impedance or an open in the frequency band 2f. A capacitance of the eighth capacitor 507 is set to a level great enough to cut a bias current. A total length of the fourth transmission line 506 and the third transmission line 503 is equal to ½ the wavelength in the frequency band 2f. A capacitance of the ninth capacitor 509 is set to a level great enough to be short-circuited in a frequency band higher than the band f.

A bias current from the power source 508, being a direct current, flows not in the ninth capacitor 509, the seventh capacitor 505, and the eighth capacitor 507 but in the fourth transmission line 506 and the third transmission line 503 to drive the amplifier circuit 501. The amplifier circuit 501 amplifies a signal in the frequency band f and may simultaneously generate harmonic distortions. As the bias circuit 510 is an open in the frequency band f, the amplified signal flows not in the bias circuit 510 but in the output matching circuit 502.

Since the ninth capacitor 509 is short-circuited, the third inductor 504 and the seventh capacitor 505 is an open. A total length of the third transmission line 503 and the fourth transmission line 506 is equal to ½ the wavelength in the frequency band 2f, and the bias circuit 510 thus functions as a notch circuit. Hence, the harmonic distortions in an amplified signal in the frequency band 2f can be attenuated and can not be transferred to the output matching circuit 502 to be output.

Similarly, since the seventh capacitor 505 is short-circuited, and since the length of the third transmission line 503 is equal to ½ the wavelength in the frequency band 3f, the bias circuit 510 functions as a notch circuit. Hence, the harmonic distortions in an amplified signal in the frequency band 3f can be attenuated and do not flow in the output matching circuit 502.

As a result, the bias circuit 510 interrupts the amplified signal in the frequency band f and can attenuate the harmonic distortions in the signal in the frequency bands 2f and 3f.

Figure 6:
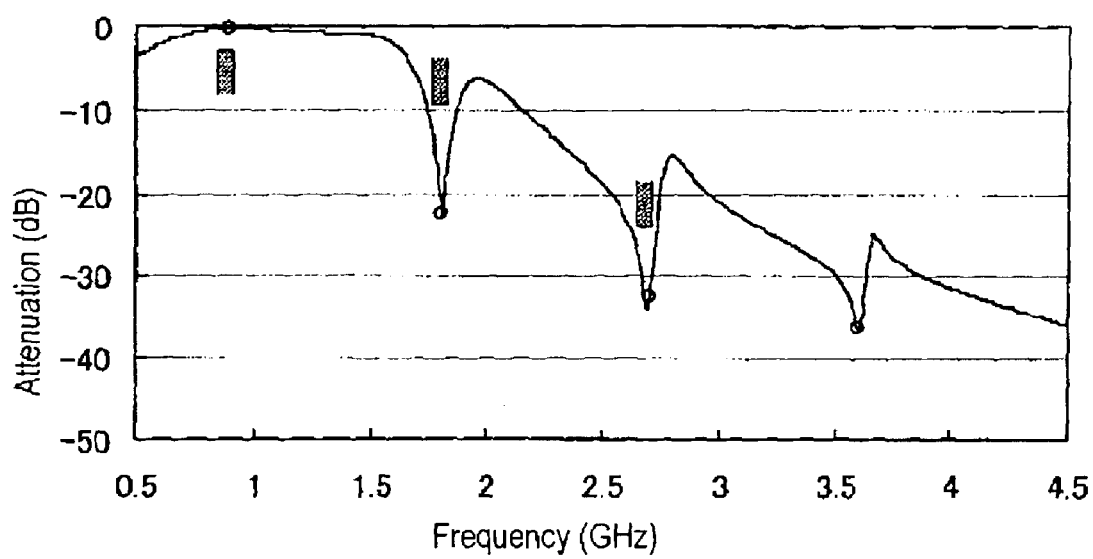
FIG. 6 is a frequency response diagram of the high-frequency amplifier according to Embodiment 3.

FIG. 6 illustrates a frequency response of the amplifier where an output impedance of the amplifier circuit 501 is 3.2-j5.7Ω at f=900MHz. As apparent, the matching is achieved, in the frequency band f, and the signal passes while a signal in the frequency bands 2f and 3f do not pass.

A length of the third transmission line 503 in Embodiment 3 is equal to ½ the wavelength in the frequency band 3f. The length may be equal to ½ the wavelength in the frequency band m×f (where m is a prime number not smaller than 3). The total length of the third transmission line 503 and the fourth transmission line 506 is equal to ½ the wavelength in the frequency band 2f. The length may be equal to ½ the wavelength in the frequency band n×f (where n is an integer of not smaller than 2). If m>n, the high-frequency amplifier attenuates the harmonic distortions of the signal at m times and n times greater the frequency band f.

The length of the third transmission line 503 of Embodiment 3 is equal to ½ the wavelength in the frequency band 3f. The third transmission line 503 may be replaced by a bias circuit, a parallel circuit constructed by the second transmission line 403 and the fifth capacitor 404 shown in FIG. 4. The parallel circuit has a capacitive composite impedance in the frequency band 3f. If the composite impedance series-resonates with the third inductor 504 in the frequency band 3f and series-resonates with the seventh capacitor 505 in the frequency band 2f, the bias circuit 510 functions as a notch circuit in the bands 2f and 3f. Since the third transmission line 503 may be shortened, the voltage drop due to the bias current can be reduced thus improving an efficiency of the high-frequency amplifier.

Figure 7:
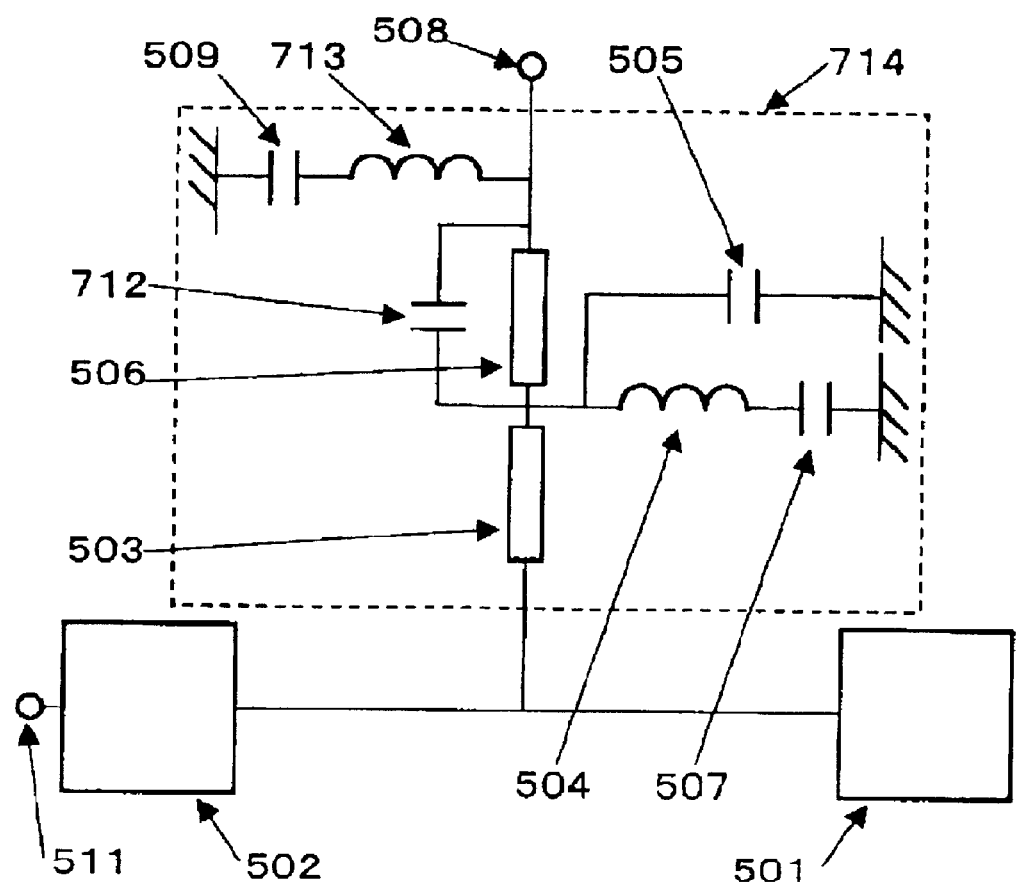
FIG. 7 is a circuitry diagram of another high-frequency amplifier according to Embodiment 3.

The other end of the fourth transmission line 506 of Embodiment 3 is connected to the power source 508 and simultaneously is grounded via the ninth capacitor 509. As shown in FIG. 7, the fourth transmission line 506 may be replaced by a parallel circuit constructed by the fourth transmission line 506 and a tenth capacitor 712, and a fourth inductor 713 provided between the ninth capacitor 509 and the parallel circuit. In this case, the total length of the third transmission line 503 and the fourth transmission line 506 is shorter than ¼ the wavelength in the frequency band f. Since being capacitive in the band 2f, the composite impedance of the parallel circuit series-resonates with the inductance of the fourth inductor 713. A capacitance of the ninth capacitor 509 is set to a level great enough to cut a bias current. As a result, the bias circuit 714 functions as a notch circuit in the frequency bands 2f and 3f. Simultaneously, the fourth transmission line 506 remains short and can reduce a voltage drop due to the bias current thus improving the efficiency of the high-frequency amplifier.

The transmission line and the capacitors in Embodiment 3 may be implemented by any applicable manner, the present invention is not limited to details of the implementation.

A mobile communication device equipped with the high-frequency amplifier of Embodiment 3 can attenuate the harmonic distortions with its simpler circuitry arrangement and decrease the voltage drop due to the bias current thus having a reduced overall size and an improved performance.

Embodiment 4

Figure 8:
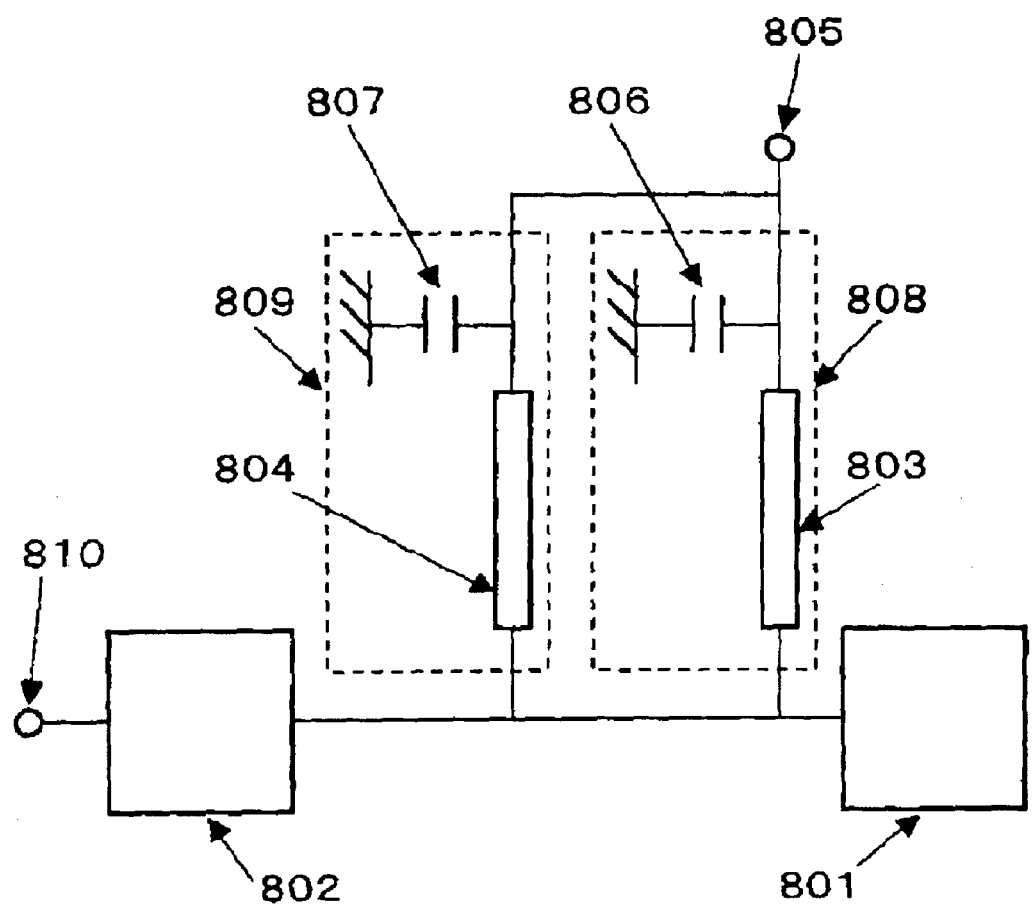
FIG. 8 is a circuitry diagram of a high-frequency amplifier according to Embodiment 4 of the invention.

FIG. 8 is a circuit diagram of a high-frequency amplifier according to Embodiment 4 of the present invention. A fifth transmission line 803 and a sixth transmission line 804 have respective first ends connected between an amplifier circuit 801 and an output matching circuit 802. The other end of the fifth transmission line 803 is connected to a power source 805 and is grounded via an eleventh capacitor 806. Similarly, the other end of the sixth transmission line 804 is connected to the power source 805 and is grounded via a twelfth capacitor 807.

An operation of the high-frequency amplifier will be described.

Each of the fifth transmission line 803 and the sixth transmission line 804 has a length equal to ¼ the wavelength in the frequency band f Each of the eleventh capacitor 806 and the twelfth capacitor 807 has a capacitance great enough to be short-circuited in a frequency band f or higher.

A bias current from the power source 805, being a direct current and being transmitted to neither the eleventh capacitor 806 nor the twelfth capacitor 807, is separated into two currents, one in the fifth transmission line 803 and the other in the sixth transmission line 804, and is then combined to flow in the amplifier circuit 801 to drive the circuit 801. The amplifier circuit 801 amplifies a signal in the frequency band f and may simultaneously generate harmonic distortions. Since the eleventh capacitor 806 is short-circuited in the frequency band f and is an open, the signal is inverted in phase in the frequency band f at one end of the fifth transmission line 803, which is thus an open. This makes the amplifier signal not to flow in a first bias circuit 808. Similarly, the twelfth capacitor 807 is short-circuited in the frequency band f and is an open, the signal is inverted in phase at one end of the sixth transmission line 804, which is thus an open. This makes the amplifier signal not to flow in a second bias circuit 809. Accordingly, the signal amplified by the amplifier circuit 801 is output from the output matching circuit 802.

Since the eleventh capacitor 806 is short-circuited in the frequency band 2f, and since the fifth transmission line 803 is equal to ½ the wavelength, the first bias circuit 808 functions as a notch circuit. Hence, the harmonic distortions in an amplified signal in the frequency band 2f can be attenuated and not flow in the output matching circuit 802. Similarly, since the twelfth capacitor 807 is short-circuited in the frequency band 2f, and since the sixth transmission line 804 is equal to ½ the wavelength, the second bias circuit 809 functions as a notch circuit. Hence, the harmonic distortions in an amplified signal at the frequency band 2f can be attenuated and not flow in the output matching circuit 802.

The bias circuits functions as notch circuits even in a frequency band being an even number of times greater than the band f and, thus, have frequency responses exhibiting attenuation poles.

Figure 9:
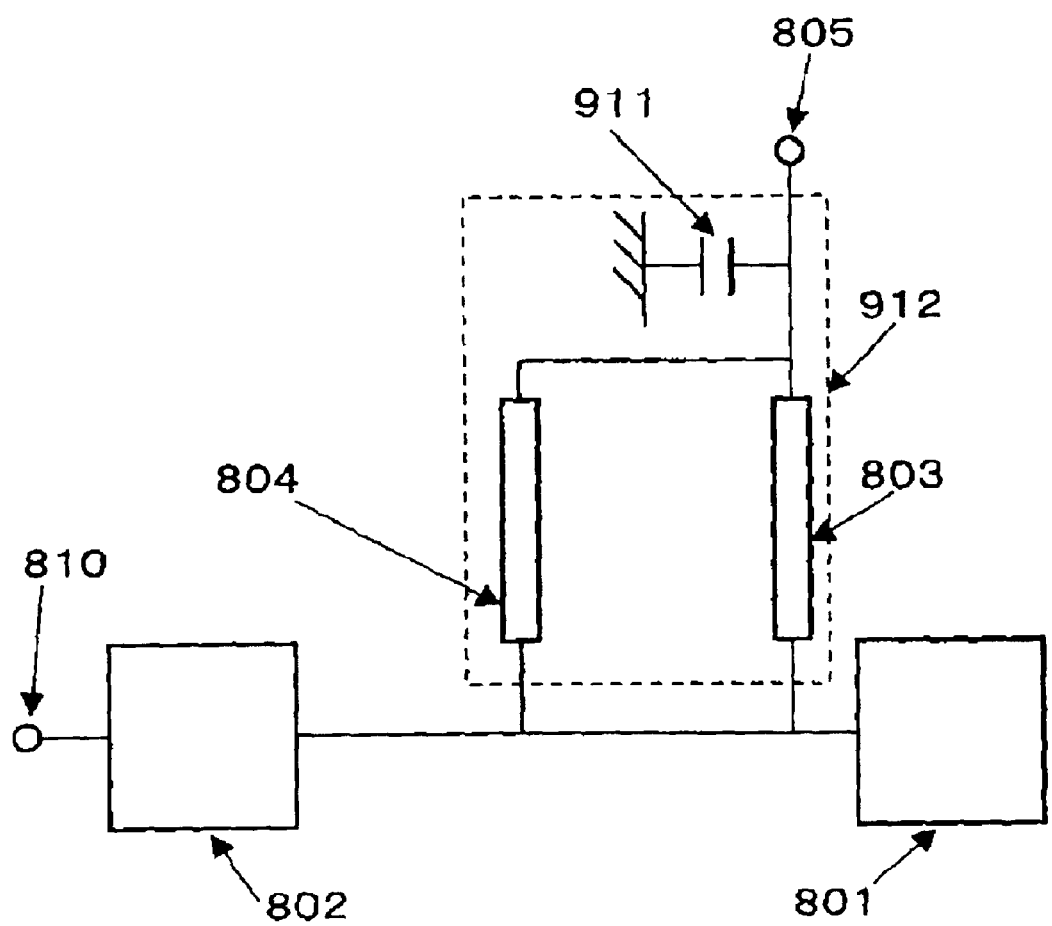
FIG. 9 is a circuitry diagram of another high-frequency amplifier according to Embodiment 4.

According to Embodiment 4, the notching effect can be doubled at the same frequency band while the voltage drop is reduced to half. As a result, the high-frequency amplifier can be improved in operating efficiency and enhanced in the attenuation of the harmonic distortions mainly at the frequency band 2f The two bias circuits in Embodiment 4 include respective capacitors short-circuited in a frequency band higher than the band f. The capacitors may be a single capacitor as shown in FIG. 9. In this case, the bias circuits can be installed in a reduced area.

The two bias circuits in Embodiment 4 are identical in construction. At least one of them may be accompanied with the bias circuit 107 shown in FIG. 1. Since the bias circuit 107 exhibits notching effect in the frequency band 3f, the circuits attenuate the harmonic distortions in the band 3f as well as in the band 2f (the bands 4f, 6f, . . .).

The bias circuit and the output matching circuit in Embodiment 4 may be implemented by the bias circuit 207 and the output matching circuit 202 shown in FIG. 2, respectively. In this case, the harmonic distortions in the frequency bands 2f and 3f can be substantially attenuated while the number of components used for the circuits is reduced.

At least one of the respective transmission lines in the bias circuits in Embodiment 4 may be replaced by either the bias circuit 408 shown in FIG. 4 or the bias circuit 510 shown in FIG. 5. Alternatively, the bias circuit 714 shown in FIG. 7 may be added to reduce the voltage drop due to the bias current This attenuates the harmonic distortions even more in the frequency band 2f (4f, 6f, . . .) and also in the frequency band 3f.

Figure 10:
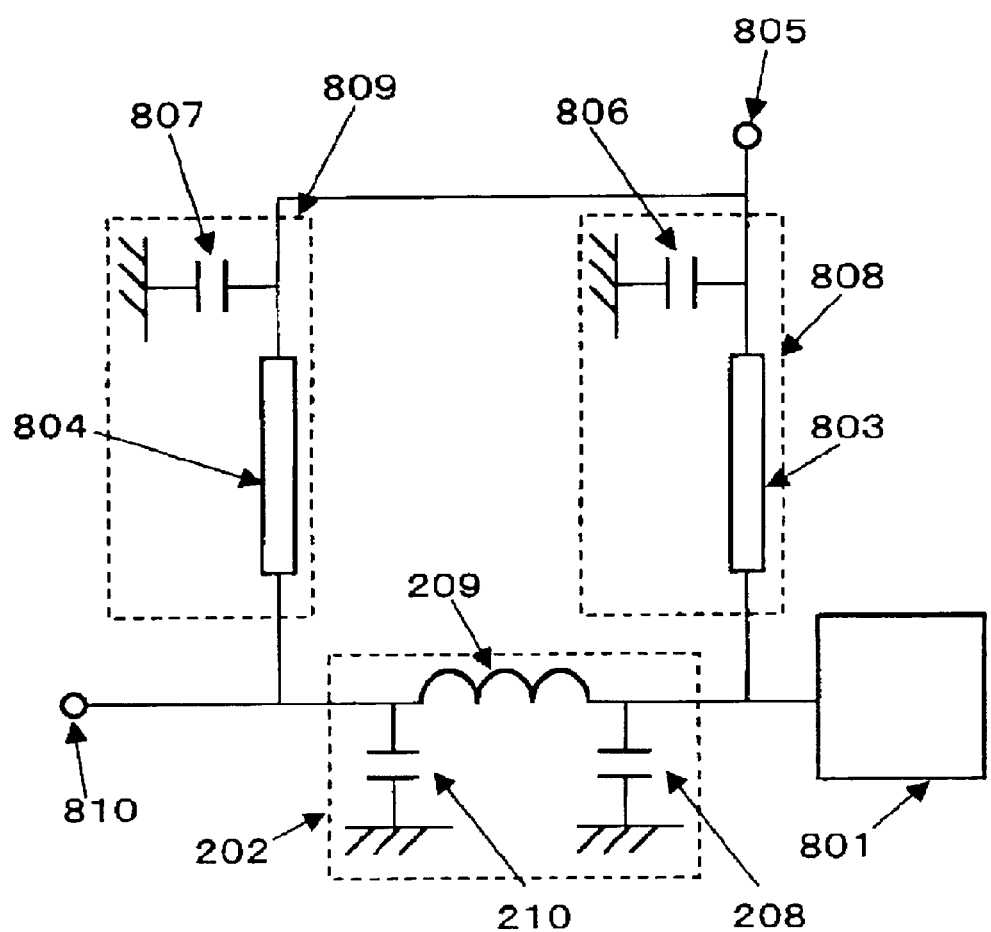
FIG. 10 is a circuitry diagram of a further high-frequency amplifier according to Embodiment 4.

The respective transmission lines of the bias circuits in Embodiment 4 are connected between the amplifier circuit 801 and the output matching circuit 802. The output matching circuit 802 may be replaced by the output matching circuit 202 shown in FIG. 2, and the two bias circuits may be connected to respective ends of the first inductor 209 as shown in FIG. 10. In this case, the connection between the amplifier 801 and the output matching circuit 202 can be shortened thus reducing a loss of the signal in the frequency band f.

If the bias circuit connected to the node between the first inductor 209 and the fourth capacitor 210 is identical to the bias circuit 107 shown in FIG. 1, the capacitance of the first capacitor 104 may be included in the fourth capacitor 210. In this case, the bias circuits can be installed in a reduced area.

The present invention is not limited to the details of the arrangement of the transmission lines and the capacitors in Embodiment 4.

A mobile communication device equipped with the high-frequency amplifier of this embodiment can attenuate the harmonic distortions with its simpler circuitry arrangement thus having a reduced overall size and an improved performance.

Figure 11:
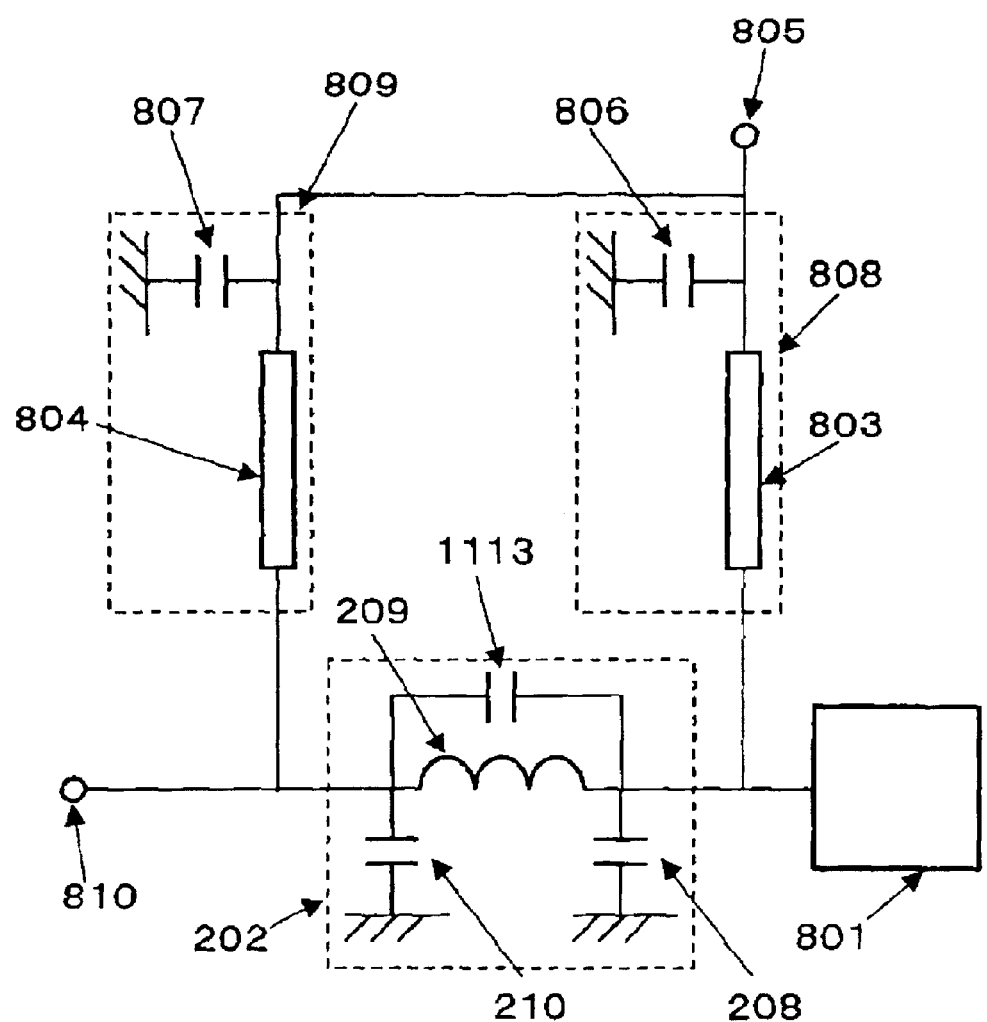
FIG. 11 is a circuitry diagram of a further high-frequency amplifier according to Embodiment 4.

If the output matching circuit is implemented by the output matching circuit 202 including the third capacitor 208, the first inductor 209, and the fourth capacitor 210 shown in FIG. 2, the first inductor 209 may be connected in parallel with a fourteenth capacitor 1113 to form a parallel circuit as shown in FIG. 11. This shortens a flowing line of the output signal thus reducing a loss of the signal. The parallel circuit, upon having a resonant point matched with the frequency band 2f or 3f of the harmonic distortions generated in the amplifier circuit 801, to eliminate the harmonic distortions. This effect may be applicable to any of Embodiments 1, 2, and 3.

Embodiment 5

Figure 12:
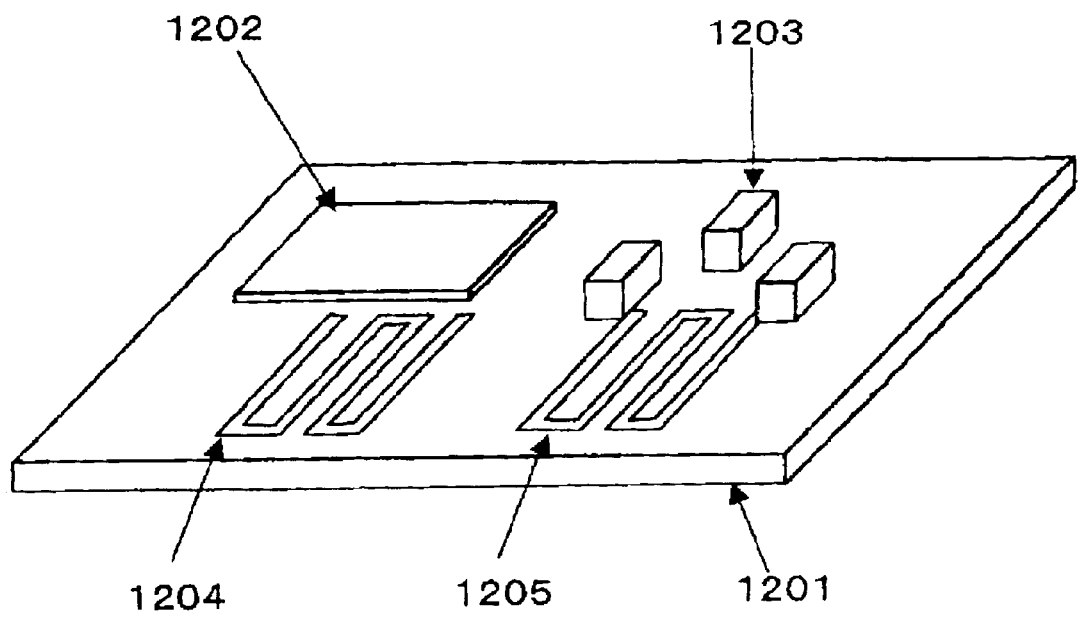
FIG. 12 is a perspective view of a high-frequency amplifier according to Embodiment 5 of the invention.

FIG. 12 is a perspective view of a high-frequency amplifier according to Embodiment 5 of the present invention. A power amplifier integrated circuit (PA-IC) 1202 and a chip capacitor 1203 are mounted on a dielectric substrate 1201, and transmission lines 1204 and inductors 1205 are formed by an electrode pattern. These forms an equivalent circuit to the circuits of Embodiments 1, 2, 3, and 4 described previously.

An operation of the circuit at high-frequencies is identical to those of Embodiments 1, 2, 3, and 4. Embodiment 5 allows transmission lines, inductors, and electrode connections between other devices to be fabricated in one step, thus contributing to cost reduction of the high-frequency amplifier.

While the transmission lines are formed by an electrode pattern on the dielectric substrate, they may be replaced by chip inductors. In this case, the circuit can be installed in a reduced area.

Embodiment 6

Figure 13:
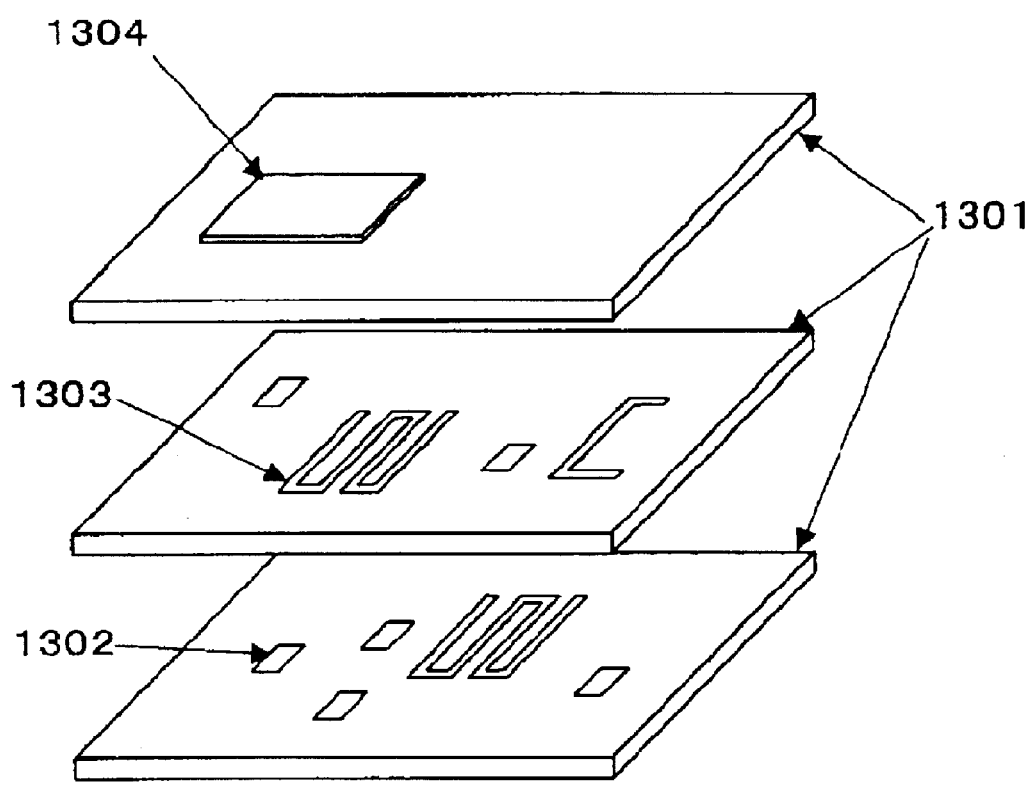
FIG. 13 is a perspective view of a high-frequency amplifier according to Embodiment 6 of the invention.
Figure 14:
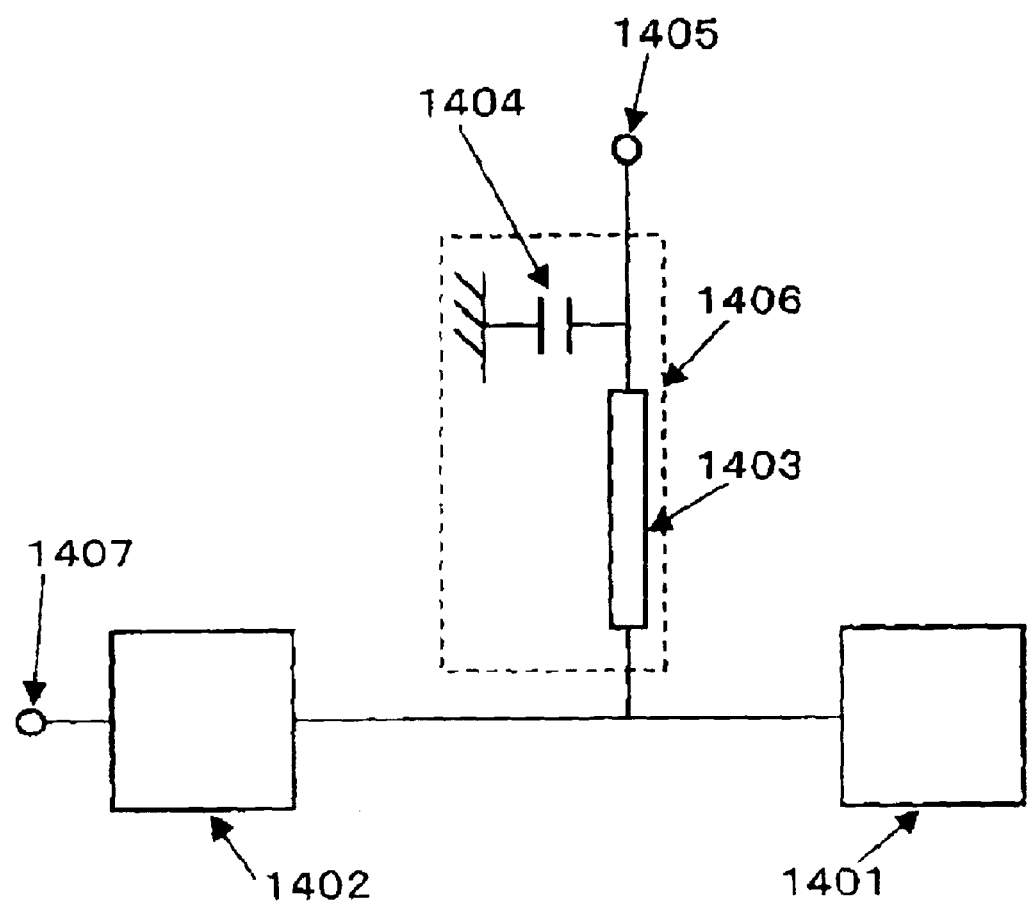
FIG. 14 is a circuitry diagram of a conventional high-frequency amplifier.
Figure 15:
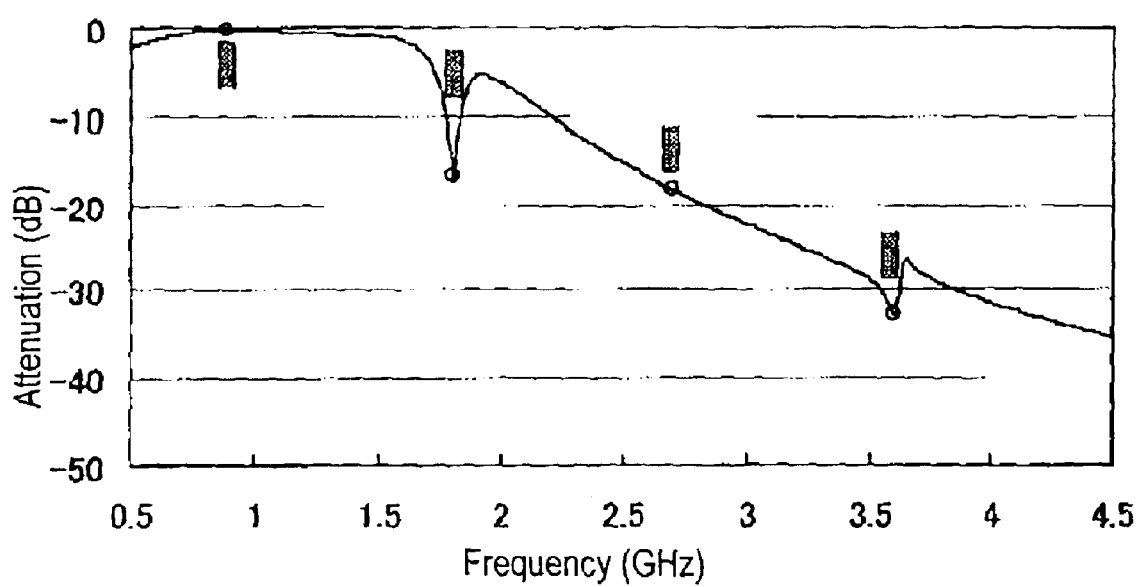
FIG. 15 is a frequency response diagram of the conventional high-frequency amplifier.

FIG. 13 is a perspective view of a high-frequency amplifier according to Embodiment 6 of the present invention. The high-frequency amplifier includes capacitor electrodes 1302 and inductor electrodes 1303 on dielectric layers 1301. A power amplifier integrated circuit (PA-IC) 1304 is mounted on the uppermost dielectric layer, and components are connected electrically. An equivalent of the circuit is that of any of Embodiments 1, 2, 3, and 4.

An operation of the circuit at high frequencies is identical to that of any of Embodiments 1, 2, 3, and 4. This embodiment allows transmission lines, inductors, and capacitors to be formed in a laminated body including the stacked dielectric layers. This reduces the number of the components and contributing to cost reduction of the high-frequency amplifier.

While the transmission lines, the inductors, and the capacitors are formed between the layers, some portions of them may be implemented by a chip construction or an electrode pattern on the same layer as that having the PA-IC 1304 mounted thereon. This allows the circuitry to be designed more freely.

INDUSTRIAL APPLICABILITY

A high-frequency amplifier of the present invention including an amplifier circuit, an output matching circuit, and a bias circuit. The bias circuit is short-circuited in a desired frequency band while being an open in a frequency band of a signal to be amplified by the amplifier circuit. This attenuates harmonic distortions of the signal.

Also, at least two bias circuits connected to a common power source reduce voltage drop in the bias circuits themselves, and accordingly provides the high-frequency amplifier having an improved operating efficiency while decreasing its power consumption.

What is claimed is:

1. A high-frequency amplifier comprising:
   an amplifier circuit;
   an output matching circuit connected to said amplifier circuit; and
   a bias circuit comprising:
      a first transmission line having a first end connected to a connection point between said amplifier circuit and said output matching circuit, said first transmission line having a second end connected to a power source;
      a first capacitor connected in parallel with said first transmission line;
      a second capacitor connected between said second end of said first transmission line and a ground; and
      a second inductor connected in series with said second capacitor, said second inductor being connected between said second end of said first transmission line and said around.

2. A high-frequency amplifier comprising:
   an amplifier circuit;
   an output matching circuit comprising:
      a first inductor having a first end connected to said amplifier circuit;
      a first capacitor connected between a second end of said first inductor and a ground; and
      a second capacitor connected between said first end of said first inductor and said ground;
      a fourth capacitor connected in parallel with said first inductor: and a bias circuit comprising:
         a first transmission line having a first end connected to said first end of said first inductor, said first transmission line having a second end connected to a power source; and
         a third capacitor connected between said second end of said first transmission line and said ground.

3. A high-frequency amplifier comprising:
   an amplifier circuit;
   an output matching circuit connected to said amplifier circuit; and
   a bias circuit comprising:
      a first transmission line having a first end connected between said amplifier circuit and said output matching circuit;
      a first capacitor connected between a second end of said first transmission line and a ground;
      a second transmission line having a first end connected to said second end of said first transmission line, said second transmission line having a second end connected to a power source;
      a first inductor connected between said second end of said first transmission line and said ground;
      a third capacitor connected in series with said first inductor; and
      a second capacitor connected between said second end of said second transmission line and said ground.

4. A high-frequency amplifier according to claim 3, wherein said bias circuit further comprises:
   a fourth capacitor connected in parallel with said second transmission line; and
   a fourth inductor connected in series with said second capacitor.

5. A high-frequency amplifier according to claim 1, further comprising:
   a dielectric substrate; and
   an electrode pattern on said dielectric substrate for forming a portion of said bias circuit.

6. A high-frequency amplifier according to claim 1, further comprising:
   a laminated body comprising a plurality of dielectric layers stacked therein; and
   an electrode pattern on at least one of said dielectric layers, for forming a portion of said bias circuit.

7. A high-frequency amplifier comprising:
   an amplifier circuit;
   an output matching circuit connected to said amplifier circuit;
   a first bias circuit comprising:
      a first transmission line having a first end connected to a connection point between said amplifier circuit and said output matching circuit, said first transmission line having a second end connected to a power source; and
      a first capacitor connected between said second end of said first transmission line and a ground; and
   a second bias circuit comprising:
      a second transmission line having a first end connected to said connection point between said amplifier circuit and said output matching circuit, said second transmission line having a second end connected to said power source,
   wherein said output matching circuit comprises:
      a first inductor having a first end connected to said amplifier circuit:
      a fifth capacitor connected between a second end of said first inductor and said ground;
      a sixth capacitor connected between said first end of said first inductor and said ground; and
      a seventh capacitor connected in parallel with said first inductor.

8. A high-frequency amplifier according to claim 7, wherein said second bias circuit further comprises a second capacitor connected between said second end of said second transmission line and said ground.

9. A high-frequency amplifier according to claim 7, wherein said first bias circuit further comprises a third capacitor connected in parallel with said first transmission line.

10. A high-frequency amplifier according to claim 9, wherein said second bias circuit further comprises a fourth capacitor connected in parallel with said second transmission line.

11. A high-frequency amplifier comprising:
    an amplifier circuit;
    an output matching circuit connected to said amplifier circuit;
    a first bias circuit comprising:
       a first transmission line having a first end connected to a connection point between said amplifier circuit and said output matching circuit, said first transmission line having a second end connected to a power source; and
       a first capacitor connected between said second end of said first transmission line and a ground; and
    a second bias circuit comprising:
       a second transmission line having a first end connected to said connection point between said amplifier circuit and said output matching circuit, said second transmission line having a second end connected to said power source;

a second capacitor connected in parallel with said second transmission line;

a third capacitor connected between said second end of said second transmission line and said ground; and a first inductor connected in series with said third capacitor, said first inductor being connected between said second end of said second transmission line and said ground.

12. A high-frequency amplifier comprising:

an amplifier circuit;

an output matching circuit connected to said amplifier circuit;

a first bias circuit comprising:
  a first transmission line having a first end connected to said connection point between said amplifier circuit and said output matching circuit, said first transmission line having a second end connected to a power source;
  a first capacitor connected between said second end of said first transmission line and a ground;
  a second capacitor connected between said second end of said first transmission line and said ground; and
  a first inductor connected in series with said second capacitor said first inductor being connected between said second end of said first transmission line and said around; and a second bias circuit comprising:
  a second transmission line having a first end connected to a connection point between said amplifier circuit and said output matching circuit, said second transmission line having a second end connected to said power source;
  a third capacitor connected in parallel with said second transmission line;
  a fourth capacitor connected between said second end of said second transmission line and said ground; and
  a second inductor connected in series with said fourth capacitor, said second inductor being connected between said second end of said second transmission line and said ground.

13. A high-frequency amplifier comprising:

an amplifier circuit;

an output matching circuit connected to said amplifier circuit;

a first bias circuit comprising:
  a first transmission line having a first end connected to a connection point between said amplifier circuit and said output matching circuit, said first transmission line having a second end connected to a power source;
  a first capacitor connected in parallel with said first transmission line;
  a second capacitor connected between said second end of said first transmission line and a ground; and
  a first inductor connected in series with said second capacitor; and a second bias circuit comprising:
  a second transmission line having a first end connected to said connection point between said amplifier circuit and said output matching circuit;
  a third capacitor connected between said second end of said second transmission line and said ground;
  a third transmission line having a first end connected to said second end of said second transmission line, said third transmission line having a second end connected to said power source;

a second inductor connected between said first end of said third transmission line and said ground;

a fourth capacitor connected in series with said second inductor; and a fifth capacitor connected between said second end of said third transmission line and said ground.

14. A high-frequency amplifier according to claim 13, wherein said second bias circuit further comprises:

a sixth capacitor connected in parallel with said third transmission line; and a third inductor connected in series with said fifth capacitor.

15. A high-frequency amplifier comprising:

an amplifier circuit;

an output matching circuit connected to said amplifier circuit;

a first bias circuit comprising:
  a first transmission line having a first end connected to a connection point between said amplifier circuit and said output matching circuit, said first transmission line having a second end connected to a power source; and
  a first capacitor connected between said second end of said first transmission line and a ground; and a second bias circuit comprising:
  a second transmission line having a first end connected to said connection point between said amplifier circuit and said output matching circuit;
  a second capacitor connected between said second end of said second transmission line and said ground;
  a third transmission line having a first end connected to said second end of said second transmission line, said third transmission line having a second end connected to said power source;
  a first inductor connected between said first end of said third transmission line and said ground;
  a third capacitor connected in series with said first inductor; and
  a fourth capacitor connected between said second end of said third transmission line and said ground.

16. A high-frequency amplifier according to claim 15, wherein said second bias circuit further comprises:

a fifth capacitor connected in parallel with said third transmission line; and a second inductor connected in series with said fourth capacitor.

17. A high-frequency amplifier comprising:

an amplifier circuit;

an output matching circuit connected to said amplifier circuit;

a first bias circuit comprising:
  a first transmission line having a first end connected to a connection point between said amplifier circuit and said output matching circuit;
  a first capacitor connected between a second end of said first transmission line and a ground;
  a second transmission line having a first end connected to said second end of said first transmission line, said second transmission line having a second end connected to a power source;
  a first inductor connected between said first end of said second transmission line and said ground;
  a second capacitor connected in series with said first inductor; and
  a third capacitor connected between said second end of said second transmission line and said ground; and a second bias circuit comprising:
  a third transmission line having a first end connected to said connection point between said amplifier circuit and said output matching circuit;
  a fourth capacitor connected between a second end of said third transmission line and said ground;
  a fourth transmission line having a first end connected to said second end of said third transmission line, said fourth transmission line having a second end connected to said power source;
  a second inductor connected between said first end of said fourth transmission line and said ground;
  a fifth capacitor connected in series with said second inductor; and
  a sixth capacitor connected between said second end of said fourth transmission line and said ground.

18. A high-frequency amplifier according to claim 17, wherein said second bias circuit further comprises:
  a seventh capacitor connected in parallel with said fourth transmission line; and
  a third inductor connected in series with said sixth capacitor.

19. A high-frequency amplifier according to claim 18, wherein said first bias circuit further comprises:
  an eighth capacitor connected in parallel with said second transmission line; and
  a fourth inductor connected in series with said third capacitor.

20. A high-frequency amplifier comprising:
  an amplifier circuit;
  an output matching circuit comprising:
    a first inductor having a first end connected to said amplifier circuit;
    a first capacitor connected between a second end of said first inductor and a ground;
    a second capacitor connected between said first end of said first inductor and said ground; and
    a seventh capacitor connected in parallel with said first inductor;
  a first bias circuit comprising:
    a first transmission line having a first end connected to said first end of said first inductor, said first transmission line having a second end connected to a power source; and
    a third capacitor connected between said second end of said first transmission line and said ground; and
  a second bias circuit comprising:
    a second transmission line having a first end connected to said second end of said first inductor, said second transmission line having a second end connected to said power source.

21. A high-frequency amplifier according to claim 20, wherein said second bias circuit further comprises a fourth capacitor connected between said second end of said second transmission line and said ground.

22. A high-frequency amplifier according to claim 20, wherein said first bias circuit further comprises a fifth capacitor connected in parallel with said first transmission line.

23. A high-frequency amplifier according to claim 20, wherein said second bias circuit further comprises a sixth capacitor connected in parallel with said second transmission line.

24. A high-frequency amplifier comprising:
  an amplifier circuit;
  an output matching circuit comprising:
    a first inductor having a first end connected to said amplifier circuit;
    a first capacitor connected between a second end of said first inductor and a ground; and
    a second capacitor connected between said first end of said first inductor and said ground;
  a first bias circuit comprising:
    a first transmission line having a first end connected to said first end of said first inductor, said first transmission line having a second end connected to a power source; and
    a third capacitor connected between said second end of said first transmission line and said ground; and
  a second bias circuit comprising:
    a second transmission line having a first end connected to said first end of said first inductor, said second transmission line having a second end connected to said power source;
    a fourth capacitor connected in parallel with said second transmission line;
    a fifth capacitor connected between said second end of said second transmission line and said ground; and
    a second inductor connected in series with said fifth capacitor, said second inductor being connected between said second end of said second transmission line and said around.

25. A high-frequency amplifier comprising:
  an amplifier circuit;
  an output matching circuit comprising:
    a first inductor having a first end connected to said amplifier circuit;
    a first capacitor connected between a second end of said first inductor and a ground; and
    a second capacitor connected between said first end of said first inductor and said ground;
  a first bias circuit comprising:
    a first transmission line having a first end connected to said first end of said first inductor, said first transmission line having a second end connected to a power source; and
    a third capacitor connected between said second end of said first transmission line and said ground; and
  a second bias circuit comprising:
    a second transmission line having a first end connected to said second end of said first inductor;
    a fourth capacitor connected between a second end of said second transmission line and said ground;
    a third transmission line having a first end connected to said second end of said second transmission line, said third transmission line having a second end connected to said power source;
    a second inductor connected between said first end of said third transmission line and said ground;
    a fifth capacitor connected in series with said second inductor; and
    a sixth capacitor connected between said second end of said third transmission line and said ground.

26. A high-frequency amplifier according to claim 25, wherein said second bias circuit further comprises:
  a seventh capacitor connected in parallel with said third transmission line, and
  a third inductor connected in series with said sixth capacitor.

27. A high-frequency amplifier comprising:
  an amplifier circuit;
  an output matching circuit comprising:

a first inductor having a first end connected to said amplifier circuit;
a first capacitor connected between a second end of said first inductor and a ground; and
a second capacitor connected between said first end of said first inductor and said ground;
a first bias circuit comprising:
a first transmission line having a first end connected to said first end of said first inductor, said first transmission line having a second end connected to a power source;
a third capacitor connected in parallel with said first transmission line;
a fourth capacitor connected between said second end of said first transmission line and said ground; and
a second inductor connected in series with said fourth capacitor; and
a second bias circuit comprising:
a second transmission line having a first end connected to said first end of said first inductor, said second transmission line having a second end connected to said power source; and
a fifth capacitor connected between said second end of said second transmission line and said ground.

28. A high-frequency amplifier comprising:
an amplifier circuit;
an output matching circuit comprising:
a first inductor having a first end connected to said amplifier circuit;
a first capacitor connected between a second end of said first inductor and a ground; and
a second capacitor connected between said first end of said first inductor and said ground;
a first bias circuit comprising:
a first transmission line having a first end connected to said first end of said first inductor, said first transmission line having a second end connected to a power source;
a third capacitor connected in parallel with said first transmission line;
a fourth capacitor connected between said second end of said first transmission line and said ground; and
a second inductor connected in series with said fourth capacitor, said second inductor being connected between said second end of said first transmission line and said ground; and
a second bias circuit comprising:
a second transmission line having a first end connected to said first end of said first inductor, said second transmission line having a second end connected to said power source;
a fifth capacitor connected in parallel with said second transmission line;
a sixth capacitor connected between said second end of said second transmission line and said ground; and
a third inductor connected in series with said sixth capacitor said third inductor being connected between said second end of said second transmission line and said around.

29. A high-frequency amplifier comprising:
an amplifier circuit;
an output matching circuit comprising:
a first inductor having a first end connected to said amplifier circuit;
a first capacitor connected between a second end of said first inductor and a ground; and
a second capacitor connected between said first end of said first inductor and said ground;
a first bias circuit comprising:
a first transmission line having a first end connected to said first end of said first inductor, said first transmission line having a second end connected to a power source;
a third capacitor connected in parallel with said first transmission line;
a fourth capacitor connected between said second end of said first transmission line and said ground; and
a second inductor connected in series with said fourth capacitor; and
a second bias circuit comprising:
a second transmission line having a first end connected to said second end of said first inductor;
a fifth capacitor connected between a second end of said second transmission line and said ground;
a third transmission line having a first end connected to said second end of said second transmission line, said third transmission line having a second end connected to said power source;
a third inductor connected between said first end of said third transmission line and said ground;
a sixth capacitor connected in series with said third inductor; and
a seventh capacitor connected between said second end of said third transmission line and said ground.

30. A high-frequency amplifier according to claim 29, wherein said second bias circuit further comprises:
an eighth capacitor connected in parallel with said third transmission line; and
a fourth inductor connected in series with said seventh capacitor.

31. A high-frequency amplifier comprising:
an amplifier circuit;
an output matching circuit comprising:
a first inductor having a first end connected to said amplifier circuit;
a first capacitor connected between a second end of said first inductor and a ground; and
a second capacitor connected between said first end of said first inductor and said ground;
a first bias circuit comprising:
a first transmission line having a first end connected to said first end of said first inductor;
a third capacitor connected between a second end of said first transmission line and said ground;
a second transmission line having a first end connected to said second end of said first transmission line, said second transmission line having a second end connected to a power source;
a second inductor connected between said first end of said second transmission line and said ground;
a fourth capacitor connected in series with said second inductor; and
a fifth capacitor connected between said second end of said second transmission line and said ground; and
a second bias circuit comprising:
a third transmission line having a first end connected to said first end of said first inductor, said third transmission line having a second end connected to said power source;
a sixth capacitor connected in parallel with said third transmission line;
a seventh capacitor connected between said second end of said third transmission line and said ground; and a third inductor connected in series with said seventh capacitor.

32. A high-frequency amplifier according to claim 31, wherein said first bias circuit further comprises:
an eighth capacitor connected in parallel with said second transmission line; and
a fourth inductor connected in series with said fifth capacitor.

33. A high-frequency amplifier comprising:
an amplifier circuit;
an output matching circuit comprising:
a first inductor having a first end connected to said amplifier circuit;
a first capacitor connected between a second end of said first inductor and said ground; and
a second capacitor connected between said first end of said first inductor and a ground;
a first bias circuit comprising:
a first transmission line having a first end connected to said first end of said first inductor;
a third capacitor connected between a second end of said first transmission line and said ground;
a second transmission line having a first end connected to said second end of said first transmission line, said second transmission line having a second end connected to a power source;
a second inductor connected between said first end of said second transmission line and said ground;
a fourth capacitor connected in series with said second inductor; and
a fifth capacitor connected between said second end of said second transmission line and said ground; and
a second bias circuit comprising:
a third transmission line having a first end connected to said second end of said first inductor, said third transmission line having a second end connected to said power source;
a sixth capacitor connected in parallel with said third transmission line;
a seventh capacitor connected between said second end of said third transmission line and said ground; and
a third inductor connected in series with said seventh capacitor.

34. A high-frequency amplifier according to claim 33, wherein said first bias circuit further comprises:
an eighth capacitor connected in parallel with said second transmission line; and
a fourth inductor connected in series with said fifth capacitor.

35. A high-frequency amplifier comprising:
an amplifier circuit;
an output matching circuit comprising:
a first inductor having a first end connected to said amplifier circuit;
a first capacitor connected between a second end of said first inductor and a ground; and
a second capacitor connected between said first end of said first inductor and said ground;
a first bias circuit comprising:
a first transmission line having a first end connected to said first end of said first inductor;
a third capacitor connected between a second end of said first transmission line and said ground;
a second transmission line having a first end connected to said second end of said first transmission line, said second transmission line having a second end connected to a power source;
a second inductor connected between said first end of said second transmission line and said ground;
a fourth capacitor connected in series with said second inductor; and
a fifth capacitor connected between said second end of said second transmission line and said ground; and
a second bias circuit comprising:
a third transmission line having a first end connected to said first end of said first inductor;
a sixth capacitor connected between a second end of said third transmission line and said ground;
a fourth transmission line having a first end connected to said second end of said third transmission line, said fourth transmission line having a second end connected to said power source;
a third inductor connected between said first end of said fourth transmission line and said ground;
a seventh capacitor connected in series with said third inductor; and
an eighth capacitor connected between said second end of said fourth transmission line and said ground.

36. A high-frequency amplifier according to claim 35, wherein said first bias circuit further comprises:
a ninth capacitor connected in parallel with said second transmission line; and
a fourth inductor connected in series with said fifth capacitor.

37. A high-frequency amplifier according to claim 36, wherein said second bias circuit further comprises:
a tenth capacitor connected in parallel with said fourth transmission line; and
a fifth inductor connected in series with said eighth capacitor.

38. A high-frequency amplifier according to claim 24, wherein said output matching circuit further comprises a parallel capacitor connected in parallel with said first inductor.

39. A high-frequency amplifier according to claim 7, further comprising:
a dielectric substrate; and
an electrode pattern on said dielectric substrate, for forming at least a portion of said first and second bias circuits.

40. A high-frequency amplifier according to claim 7, further comprising:
a laminated body comprising a plurality of dielectric layers stacked therein; and
an electrode pattern on at least one of said dielectric layers, for forming a portion of said first and second bias circuits.

41. A communication device comprising:
said high-frequency amplifier according to claim 1.

42. A high-frequency amplifier according to claim 2, further comprising:
a dielectric substrate; and
an electrode pattern on said dielectric substrate for forming a portion of said bias circuit.

43. A high-frequency amplifier according to claim 2, further comprising:
a laminated body comprising a plurality of dielectric layers stacked therein; and
an electrode pattern on at least one of said dielectric layers, for forming a portion of said bias circuit.

44. A high-frequency amplifier according to claim 3, further comprising:
a dielectric substrate; and
an electrode pattern on said dielectric substrate for forming a portion of said bias circuit.

45. A high-frequency amplifier according to claim 3, further comprising:
a laminated body comprising a plurality of dielectric layers stacked therein; and
an electrode pattern on at least one of said dielectric layers, for forming a portion of said bias circuit.

46. A high-frequency amplifier according to claim 25, wherein said output matching circuit further comprises a parallel capacitor connected in parallel with said first inductor.

47. A high-frequency amplifier according to claim 27, wherein said output matching circuit further comprises a parallel capacitor connected in parallel with said first inductor.

48. A high-frequency amplifier according to claim 29, wherein said output matching circuit further comprises a parallel capacitor connected in parallel with said first inductor.

49. A high-frequency amplifier according to claim 31, wherein said output matching circuit further comprises a parallel capacitor connected in parallel with said first inductor.

50. A high-frequency amplifier according to claim 33, wherein said output matching circuit further comprises a parallel capacitor connected in parallel with said first inductor.

51. A high-frequency amplifier according to claim 35, wherein said output matching circuit further comprises a parallel capacitor connected in parallel with said first inductor.

52. A high-frequency amplifier according to claim 7, further comprising:
a dielectric substrate; and
an electrode pattern an said dielectric substrate, for forming at least a portion of said first and second bias circuits.

53. A high-frequency amplifier according to claim 11, further comprising:
a dielectric substrate; and
an electrode pattern on said dielectric substrate, for forming at least a portion of said first and second bias circuits.

54. A high-frequency amplifier according to claim 12, further comprising:
a dielectric substrate; and
an electrode pattern on said dielectric substrate, for forming at least a portion of said first and second bias circuits.

55. A high-frequency amplifier according to claim 13, further comprising:
a dielectric substrate; and
an electrode pattern an said dielectric substrate, for forming at least a portion of said first and second bias circuits.

56. A high-frequency amplifier according to claim 15, further comprising:
a dielectric substrate; and
an electrode pattern on said dielectric substrate, for forming at least a portion of said first and second bias circuits.

57. A high-frequency amplifier according to claim 17, further comprising:
a dielectric substrate; and
an electrode pattern on said dielectric substrate, for forming at least a portion of said first and second bias circuits.

58. A high-frequency amplifier according to claim 20, further comprising:
a dielectric substrate; and
an electrode pattern on said dielectric substrate, for forming at least a portion of said first and second bias circuits.

59. A high-frequency amplifier according to claim 24, further comprising:
a dielectric substrate; and
an electrode pattern on said dielectric substrate, for forming at least a portion of said first and second bias circuits.

60. A high-frequency amplifier according to claim 25, further comprising:
a dielectric substrate; and
an electrode pattern on said dielectric substrate, for forming at least a portion of said first and second bias circuits.

61. A high-frequency amplifier according to claim 27, further comprising:
a dielectric substrate; and
an electrode pattern on said dielectric substrate, for forming at least a portion of said first and second bias circuits.

62. A high-frequency amplifier according to claim 28, further comprising:
a dielectric substrate; and
an electrode pattern on said dielectric substrate, for forming at least a portion of said first and second bias circuits.

63. A high-frequency amplifier according to claim 29, further comprising:
a dielectric substrate; and
an electrode pattern on said dielectric substrate, for forming at least a portion of said first and second bias circuits.

64. A high-frequency amplifier according to claim 31, further comprising:
a dielectric substrate; and
an electrode pattern on said dielectric substrate, for forming at least a portion of said first and second bias circuits.

65. A high-frequency amplifier according to claim 33, further comprising:
a dielectric substrate; and
an electrode pattern on said dielectric substrate, for forming at least a portion of said first and second bias circuits.

66. A high-frequency amplifier according to claim 35, further comprising:
a dielectric substrate; and
an electrode pattern on said dielectric substrate, for forming at least a portion of said first and second bias circuits.

67. A high-frequency amplifier according to claim 11, further comprising:
a laminated body comprising a plurality of dielectric layers stacked therein; and an electrode pattern on at least one of said dielectric layers, for forming a portion of said first and second bias circuits.

68. A high-frequency amplifier according to claim 12, further comprising
a laminated body comprising a plurality of dielectric layers stacked therein; and
an electrode pattern on at least one of said dielectric layers, for forming a portion of said first and second bias circuits.

69. A high-frequency amplifier according to claim 13, further comprising:
a laminated body comprising a plurality of dielectric layers stacked therein; and
an electrode pattern on at least one of said dielectric layers, for forming a portion of said first and second bias circuits.

70. A high-frequency amplifier according to claim 15, further comprising:
a laminated body comprising a plurality of dielectric layers stacked therein; and
an electrode pattern on at least one of said dielectric layers, for forming a portion of said first and second bias circuits.

71. A high-frequency amplifier according to claim 17, further comprising:
a laminated body comprising a plurality of dielectric layers stacked therein; and
an electrode pattern on at least one of said dielectric layers, for forming a portion of said first and second bias circuits.

72. A high-frequency amplifier according to claim 20, further comprising:
a laminated body comprising a plurality of dielectric layers stacked therein; and
an electrode pattern on at least one of said dielectric layers, for forming a portion of said first and second bias circuits.

73. A high-frequency amplifier according to claim 24, further comprising:
a laminated body comprising a plurality of dielectric layers stacked therein; and
an electrode pattern on at least one of said dielectric layers, for forming a portion of said first and second bias circuits.

74. A high-frequency amplifier according to claim 25, further comprising:
a laminated body comprising a plurality of dielectric layers stacked therein; and
an electrode pattern on at least one of said dielectric layers, for forming a portion of said first and second bias circuits.

75. A high-frequency amplifier according to claim 27, further comprising:
a laminated body comprising a plurality of dielectric layers stacked therein; and
an electrode pattern on at least one of said dielectric layers, for forming a portion of said first and second bias circuits.

76. A high-frequency amplifier according to claim 28, further comprising:
a laminated body comprising a plurality of dielectric layers stacked therein; and
an electrode pattern on at least one of said dielectric layers, for forming a portion of said first and second bias circuits.

77. A high-frequency amplifier according to claim 29, further comprising:
a laminated body comprising a plurality of dielectric layers stacked therein; and
an electrode pattern on at least one of said dielectric layers, for forming a portion of said first and second bias circuits.

78. A high-frequency amplifier according to claim 31, further comprising:
a laminated body comprising a plurality of dielectric layers stacked therein; and
an electrode pattern on at least one of said dielectric layers, for forming a portion of said first and second bias circuits.

79. A high-frequency amplifier according to claim 22, further comprising:
a laminated body comprising a plurality of dielectric layers stacked therein; and
an electrode pattern on at least one of said dielectric layers, for forming a portion of said first and second bias circuits.

80. A high-frequency amplifier according to claim 35, further comprising:
a laminated body comprising a plurality of dielectric layers stacked therein; and
an electrode pattern on at least one of said dielectric layers, for forming a portion of said first and second bias circuits.

81. A communication device comprising:
said high-frequency amplifier according to claim 2.

82. A communication device comprising: said high-frequency amplifier according to claim 3.

83. A communication device comprising:
said high-frequency amplifier according to claim 7.

84. A communication device comprising:
said high-frequency amplifier according to claim 11.

85. A communication device comprising:
said high-frequency amplifier according to claim 12.

86. A communication device comprising:
said high-frequency amplifier according to claim 13.

87. A communication device comprising:
said high-frequency amplifier according to claim 15.

88. A communication device comprising:
said high-frequency amplifier according to claim 17.

89. A communication device comprising:
said high-frequency amplifier according to claim 20.

90. A communication device comprising:
said high-frequency amplifier according to claim 24.

91. A communication device comprising:
said high-frequency amplifier according to claim 25.

92. A communication device comprising:
said high-frequency amplifier according to claim 27.

93. A communication device comprising:
said high-frequency amplifier according to claim 28.

94. A communication device comprising:
said high-frequency amplifier according to claim 29.

95. A communication device comprising:
said high-frequency amplifier according to claim 31.

96. A communication device comprising:
said high-frequency amplifier according to claim 33.

97. A communication device comprising:
said high-frequency amplifier according to claim 35.

* * * * *

UNITED STATES PATENT AND TRADEMARK OFFICE
CERTIFICATE OF CORRECTION

PATENT NO. : 6,768,383 B2 Page 1 of 1
DATED : July 27, 2004
INVENTOR(S) : Hiroshi Kushitani et al.

It is certified that error appears in the above-identified patent and that said Letters Patent is hereby corrected as shown below:

Column 15,
Line 59, "around" should read -- ground --.

Signed and Sealed this

Fourth Day of January, 2005

JON W. DUDAS
*Director of the United States Patent and Trademark Office*